United States Patent [19]

Chin et al.

[11] Patent Number: 5,106,783
[45] Date of Patent: * Apr. 21, 1992

[54] PROCESS FOR FABRICATING SEMICONDUCTOR DEVICES WITH SELF-ALIGNED CONTACTS

[75] Inventors: Gen M. Chin; Tzu-Yin Chiu, both of Marlboro; Te-Yin M. Liu, Red Bank; Alexander M. Voshchenkov, Freehold, all of N.J.

[73] Assignee: AT&T Bell Laboratories, Murray Hill, N.J.

[*] Notice: The portion of the term of this patent subsequent to Dec. 25, 2007 has been disclaimed.

[21] Appl. No.: 611,623

[22] Filed: Nov. 9, 1990

Related U.S. Application Data

[62] Division of Ser. No. 482,444, Feb. 20, 1990, Pat. No. 4,992,848.

[51] Int. Cl.⁵ .............................................. H01L 21/28
[52] U.S. Cl. ........................................ 437/195; 437/31; 437/33; 437/984; 148/DIG. 11
[58] Field of Search ................... 437/31, 33, 195, 984; 148/DIG. 11

[56] References Cited

U.S. PATENT DOCUMENTS

| 4,707,456 | 11/1987 | Thomas et al. | 437/31 |
| 4,871,684 | 10/1989 | Glang et al. | 437/31 |
| 4,980,304 | 12/1990 | Chin et al. | 437/31 |

FOREIGN PATENT DOCUMENTS

| 0260059 | 3/1988 | European Pat. Off. | 437/984 |
| 61-063059 | 4/1986 | Japan | 437/984 |

Primary Examiner—Brian E. Hearn
Assistant Examiner—Laura M. Holtzman
Attorney, Agent, or Firm—Gregory C. Ranieri

[57] ABSTRACT

A novel process is disclosed for fabricating semiconductor devices with self-aligned contacts. Characteristic of the resulting structure is a digitated electrode and a contiguous conductive region that contact first semiconductor regions and second semiconductor regions, respectively. The first semiconductor regions and the second semiconductor regions are formed in a semiconductor substrate, with each second semiconductor region underlying a finger of the digitated electrode. Advantageously, by forming a contiguous conductive region over the first semiconductor regions located between the fingers of the digitated electrode, it is not only possible to contact second semiconductor regions with a common electrode, but also to self-align the common electrode with the digitated electrode. Ohmic shorting between the digitated electrode and the contiguous conductive region is prevented by interposing an insulating region therebetween. Furthermore, with a single common electrode contacting the second semiconductor regions, it is possible, among other things, to effectively reduce the parasitic capacitances of the semiconductor device as well as achieve dimensional scaling since ohmic contact to the conductive region can be made outside the fingers where physical dimensions are of no limitation.

5 Claims, 4 Drawing Sheets

200

PROCESS FOR FABRICATING SEMICONDUCTOR DEVICES WITH SELF-ALIGNED CONTACTS

This is a division of application Ser. No. 482,444 filed Feb. 20, 1990 U.S. Pat. No. 4,992,848.

TECHNICAL FIELD

The present invention relates to semiconductor devices and, in particular, to a method of fabricating a semiconductor device with a self-aligned contact device.

CROSS-REFERENCE TO RELATED APPLICATION

This application is related to U.S. application Ser. No. 482,437, which was filed concurrently herewith, U.S. Pat. No. 4,980,304.

BACKGROUND OF THE INVENTION

Higher circuit density and lower power-delay product have been the impetus for recent developments in semiconductor technology. An exemplary feature of today's advanced semiconductor devices is a self-aligned polysilicon contact as described in U.S. Pat. Nos. 4,453,306 and 4,691,219. In particular, electrical contacts to active elements are made by employing highly doped polycrystalline silicon as conductive contact layers. Self-aligned polysilicon contacts have significantly improved the performance of high speed semiconductor devices by reducing the parasitic capacitances. However, prior art self-aligned contact processes have not been completely satisfactory in effectively reducing the parasitic capacitances when the dimensions of the devices are further reduced. Consequently, the operating speeds of prior art devices have been inversely dependent on the dimensions of the devices. Moreover, these devices are generally characterized by overlapping double polysilicon layers, which limits their compatibility with MOS devices due to the resulting nonplanarity.

It is therefore an object of this invention to provide a new self-aligned contact process for semiconductor devices, which is not only effective in lowering the parasitic capacitances, but also is compatible with any dimensional scaling. It is further an object of this invention to achieve surface planarity by eliminating the need for the polysilicon layers to overlap.

SUMMARY OF THE INVENTION

These and other objects are achieved in accordance with the invention, which is a novel process for fabricating a semiconductor device having a digitated electrode and a contiguous conductive region for contacting first semiconductor regions and second semiconductor regions, respectively. The first semiconductor regions and the second semiconductor regions are formed in a semiconductor substrate, with each second semiconductor region underlying a finger of the digitated electrode. Advantageously, by forming a contiguous conductive region over first semiconductor regions, which is located between the fingers of the digitated electrode, it is not only possible to contact the second semiconductor regions with a common electrode, but also to self-align the common electrode with the digitated electrode. Ohmic shorting between the digitated electrode and the contiguous conductive region is prevented by interposing an insulating region therebetween. Furthermore, with a single common electrode contacting the second semiconductor regions, it is possible, among other things, to effectively reduct the parasitic capacitances of the semiconductor device as well as achieve dimensional scaling since ohmic contact to the conductive region can be made outside the fingers where physical dimensions are of no limitations.

In one exemplary embodiment, a contiguous polysilicon region is deposited on the surface of a semiconductor substrate which acts as the self-aligned base contact for a vertical bipolar transistor having a digitated emitter electrode. The polysilicon region is in electrical contact with the extrinsic base region and, moreover, substantially fills the area between each emitter finger for providing a common electrode to portions of the base region located therein. Furthermore, each emitter finger is electrically isolated from the polysilicon region, i.e., the base electrode, by an interposed oxide sidewall. In accordance with the principles of the invention, surface planarity is achieved since the polysilicon region and oxide sidewalls are etched to substantially the same height as the digitated electrode.

BRIEF DESCRIPTION OF THE DRAWING

A more complete understanding of the invention may be obtained by reading the following description in conjunction with the appended drawing in which:

It will be appreciated that, for purposes of illustration, FIGS. 1-9 are not necessarily drawn to scale.

DETAILED DESCRIPTION

The basic principles of the invention will be described with reference to the sequence of steps as shown in FIGS. 1-8, which illustrate the principles of the novel self-aligned contact process as applied to the fabrication of an exemplary bipolar transistor. It is to be understood, however, that the following fabrication steps and particular bipolar structure are for the purpose of illustration only and not for the purpose of limitation. Other suitable semiconductor devices, whether bipolar or monopolar, could utilize the principles of invention.

Figure 1:
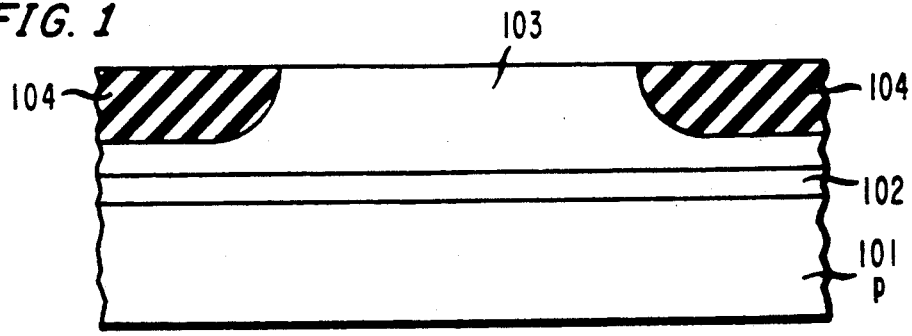
FIGS. 1-8 illustrate various steps in the fabrication of an exemplary bipolar transistor in accordance with the principles the invention.

As shown in FIG. 1, the processing begins with silicon substrate 101, which in this example is p-conductivity type, upon which is deposited an arsenic doped, blanket buried n+-layer 102, such as by ion implantation. While substrate 101 is illustrated as comprising a single piece of p-type silicon, it is to be understood that n-type silicon or a composite substrate, such as silicon-on-sapphire, could equally be used therein. Subsequently, 1.0 μm thick n-type epitaxial layer 103 was deposited by means of a chemical vapor deposition technique. N-type epitaxial layer 103 was deposited with a phosphorus concentration of approximately $7 \times 10^{16}$ in order to ensure high current operation without any significant base push-out effect. Base-collector and collector-substrate junctions isolation were achieved by utilizing planar recess local oxidation of silicon (LOCOS) and deep trench processing, respectively. $N^+$-buried layer 102 serves as the collector region for the vertical n-p-n transistor, while the active area between field oxides 104 will ultimately comprise the emitter region as well as both extrinsic and intrinsic base regions.

Figure 2:
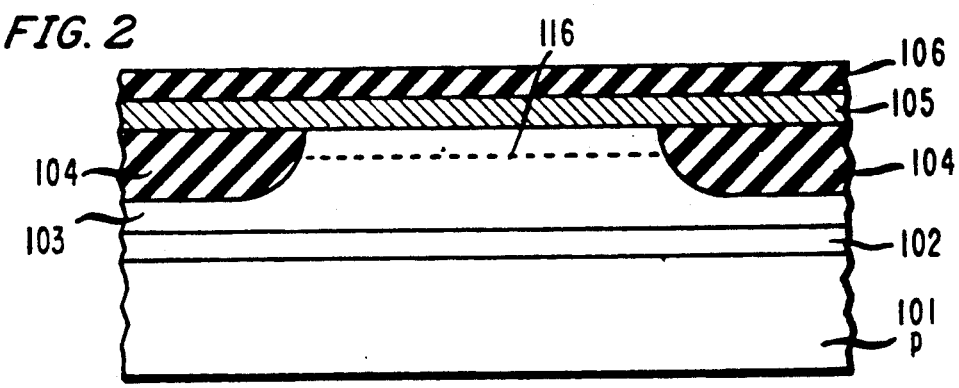

As illustrated in FIG. 2, emitter polysilicon layer 105 having a thickness of 2500 Å was then deposited over the semiconductor area. Double diffusion from polysilicon layer 105 will ultimately be used to form the emitter and intrinsic base junction and, thus, base and emitter dopants must be implanted into polysilicon layer 105. Accordingly, base and emitter dopants were introduced by a $B_{11}$ 25 KeV ($4 \times 10^{14} cm^{-2}$) implant and an arsenic 30 keV ($6 \times 10^{15} cm^{-2}$) implant, respectively. The base implant is followed by a furnace process in order to drive base dopants in the surface of N-type epitaxial layer 103, resulting in the formation of intrinsic base region 116. A typical furnace process would be a temperature of 950° C. for approximately 30 minutes in nitrogen.

Figure 3:
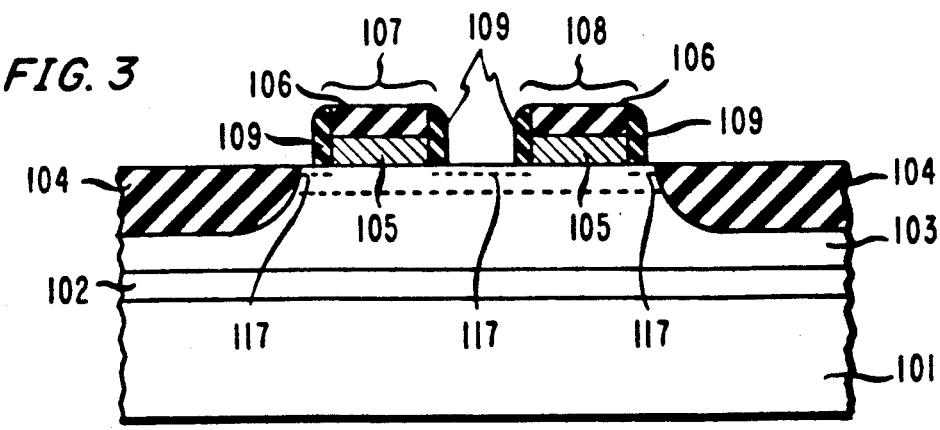

After 3000 Å thick nitride layer 106 was deposited on polysilicon layer 105, digitated electrode 131, comprising emitter fingers 107 and 108, were patterned by selective etching. As illustrated in FIG. 3, emitter fingers 107 and 108, at this point in processing, comprise polysilicon layer 105 and nitride layer 106. Utilizing a digitated electrode structure minimizes the intrinsic base resistance and, hence, allows the emitter fingers to be closely spaced to the extrinsic base region so as to reduce the total collector area. It will be appreciated that emitter fingers 107 and 108 mask the intrinsic base region thereunder from subsequent over-etch processing. In this example, the selective etch consisted of anisotropic nitride etch, which had a polysilicon etch stop, and an anisotropic silicon etch. Next, link-up regions 117 between the intrinsic base region and extrinsic base regions (to be formed later) were formed by an implantation of a low dose of boron outside emitter fingers 107,108. It is important to observe that the link-up implant was introduced to be an independent variable in order to accurately tailor the horizontal doping profile in the base region while maintaining a shallow extrinsic base junction depth. The link-up implant enables the device to achieve a narrow base width and a low base-emitter leakage without suffering premature emitter-collector punch-through. After the link-up implant, oxide sidewalls 109 are formed on the edges of emitter fingers 107 and 108 to electrically isolate the base and emitter contacts to be formed later. Several methods are available for forming these oxide sidewalls. In this example, a tetraethylorthosilicate (TEOS) oxide was deposited conformally over the entire structure to a thickness of approximately 2000 Å and was then etched anisotropically as by oxide etching. Etching was continued until field oxides 104 were exposed and also the portions of buried layer 103 not masked by emitter fingers 107 and 108 were revealed. Oxide sidewalls 109 are the vertical portions of TEOS oxide not removed due to the anisotropy of the etch.

Figure 4:
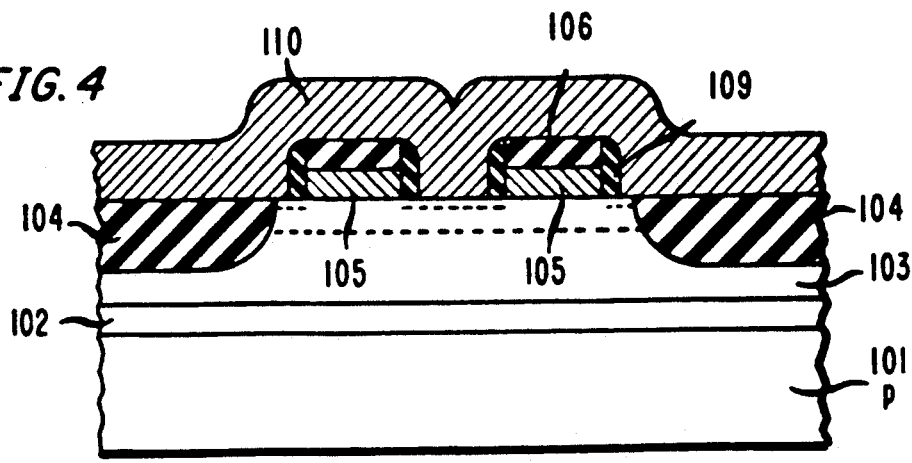
Figure 5:
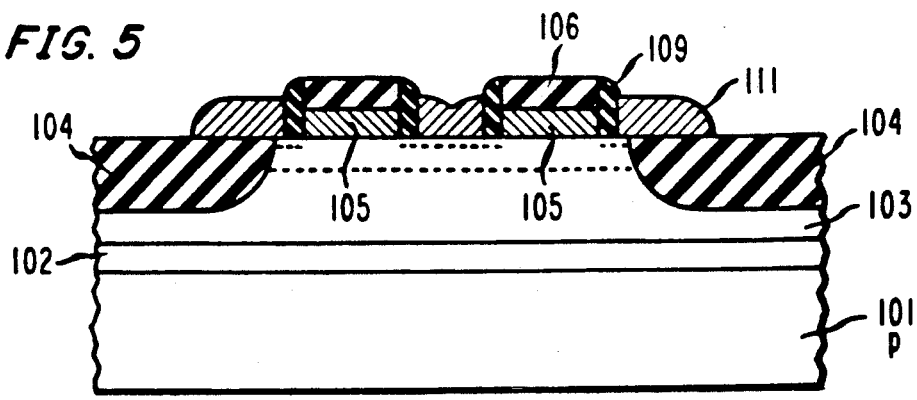
Figure 6:
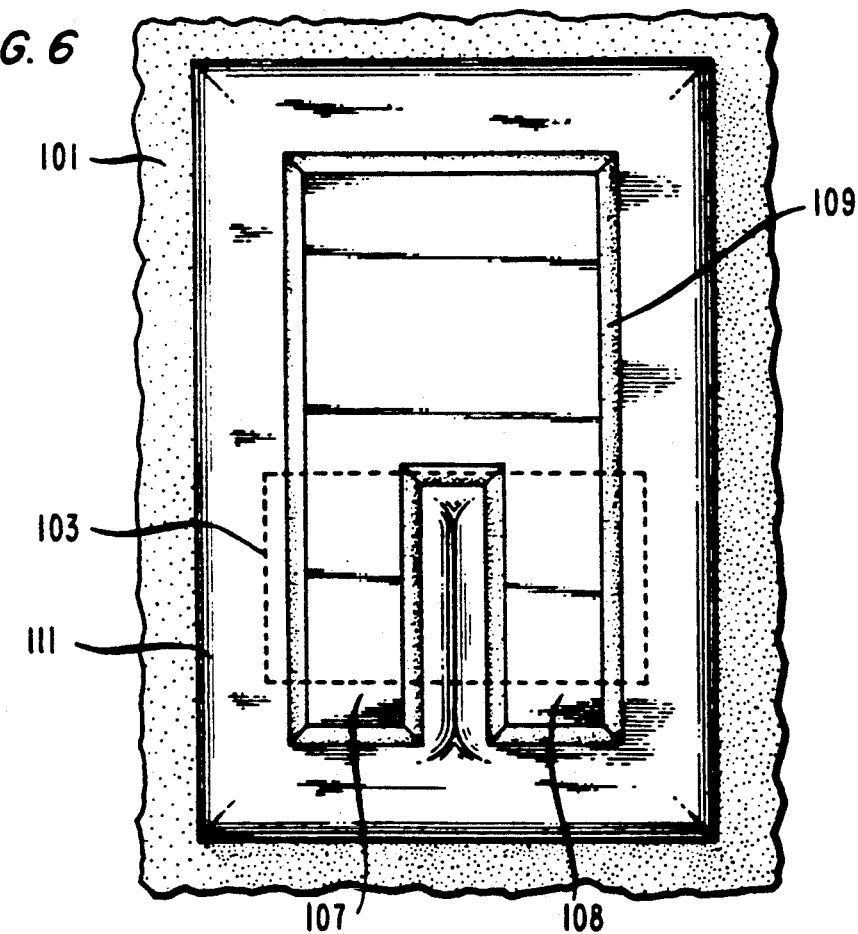

Next, referring to FIG. 4, polysilicon layer 110 was deposited conformally followed by a blanket anisotropic silicon etch, which resulted in the formation of polysilicon region 111, as shown in FIG. 5, similar to the formation of oxide sidewalls 109. Typically, polysilicon layer 110 has a thickness of approximately 0.8–1.0 μm. Polysilicon layer 110 may, alternatively, comprise an amorphous layer of silicon. In either case, however, it is contemplated that polysilicon region 111, which covers the active area between the emitter edge and the field oxide edge, acts as the base electrode. It should be noted that with a polysilicon layer thickness of 1.0 μm, a polysilicon region width of approximately 0.7 μm can be obtained. Importantly, due to the fill-up effect, the active area between emitter fingers 107 and 108 is covered by polysilicon region 111 and, thus, can provide a contiguous base contact around and inbetween the emitter fingers. It is anticipated that because of this fill-up effect, a polysilicon base contact can be deposited between emitter fingers having a lateral spacing as small as a tenth of a micron. Shown in FIG. 6, is a greatly enlarged partial plan view of FIG. 5. It is clearly shown therein that polysilicon region 111 provides a contiguous base contact around emitter fingers 107 and 108, with electrical isolation between emitter fingers 107 and 108 and polysilicon region 111 (base electrode) afforded by oxide sidewalls 109.

Figure 7:
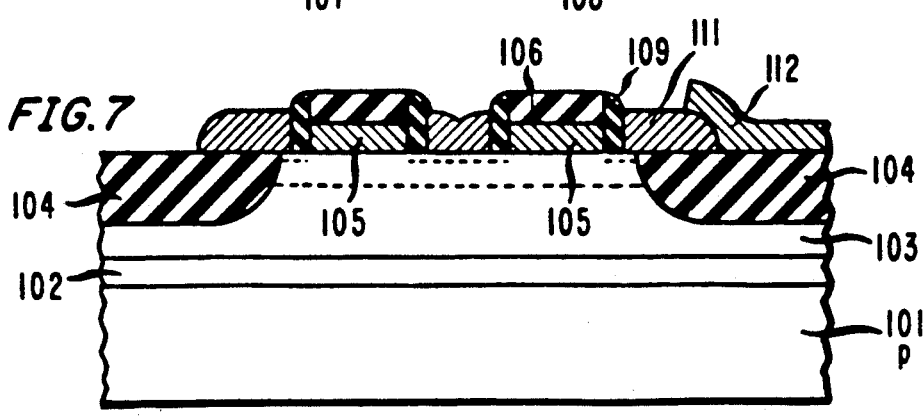

Subsequently, as shown in FIG. 7, local interconnect layer 112 was fabricated to extend polysilicon region 111 to field oxides 104 for facilitating the metalization thereof. While interconnect layer 112 facilitates the metalization of and contact to polysilicon region 111, it is contemplated that with enhanced photolithography, metalization may be made directly to silicon space 111 without interconnect 112. Because the width of polysilicon region 111 is substantially longer than the emitter to field oxide distance, the extrinsic base region can be made small, such as not to be affected by alignment tolerances. It is expected that the alignment tolerance for interconnect layer 112 will be approximately 0.9 μm, that is, the total width of the oxide sidewall and the polysilicon region.

Figure 8:
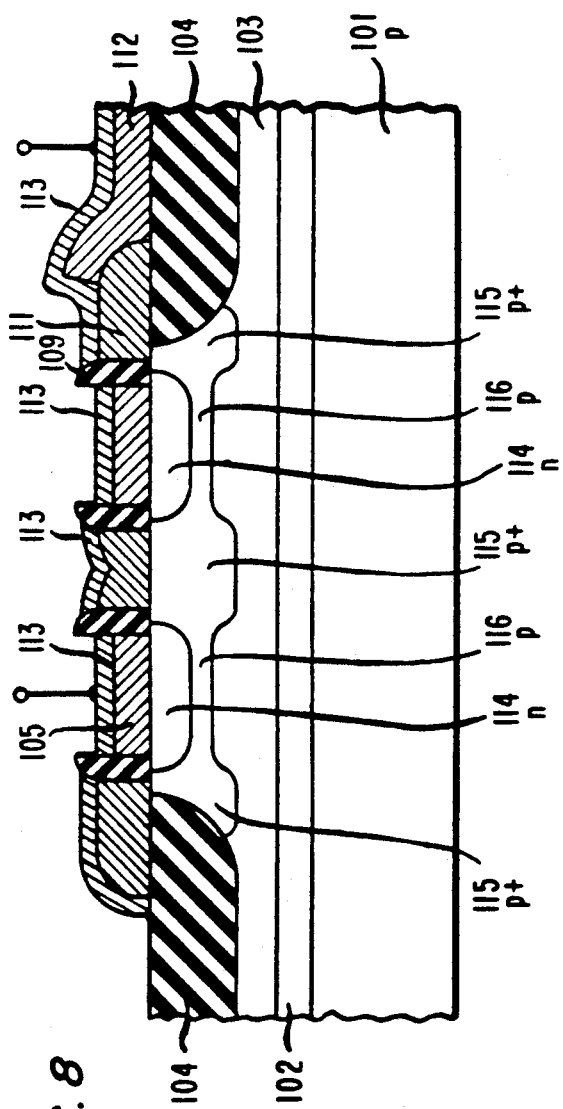

In the final sequence of steps, as shown in FIG. 8 a blanket extrinsic base implant was performed for defining extrinsic base regions 115, followed by a single junction drive-in for forming emitter regions 114. After selectively removing the prior deposited nitride, such as by hot phosphoric acid, self-aligned titanium silicide 113, was formed on both the emitter base electrode (polysilicon layer 105) and the base electrode (silicon region 111 and interconnection layer 112), as shown in FIG. 8. It will be appreciated that the use of titanium silicide 113 will lower the series resistance between ohmic contacts to the base, emitter and collector (not shown). In addition, other useful silicide forming metals, other than titanium, include nickel, palladium and tantalum. Unlike prior art self-aligned transistors wherein fabrication techniques limited the resistance of the polysilicon layer that were used as base and collector electrodes, in the present method, further metalization may be performed without any difficulties since polysilicon layer 105 (emitter electrode) and polysilicon region 111 (base electrode) form a non-overlapping structure. For example, metalization may be afforded by depositing an insulating layer (not shown) over the structure of FIG. 8 and, then, forming openings therein to expose respective portions of 113 covering the base and emitter electrodes. This may be followed by depositing metal layers over the insulator including the openings in order to provide ohmic contacts to portions of the emitter and base electrodes.

Figure 9:
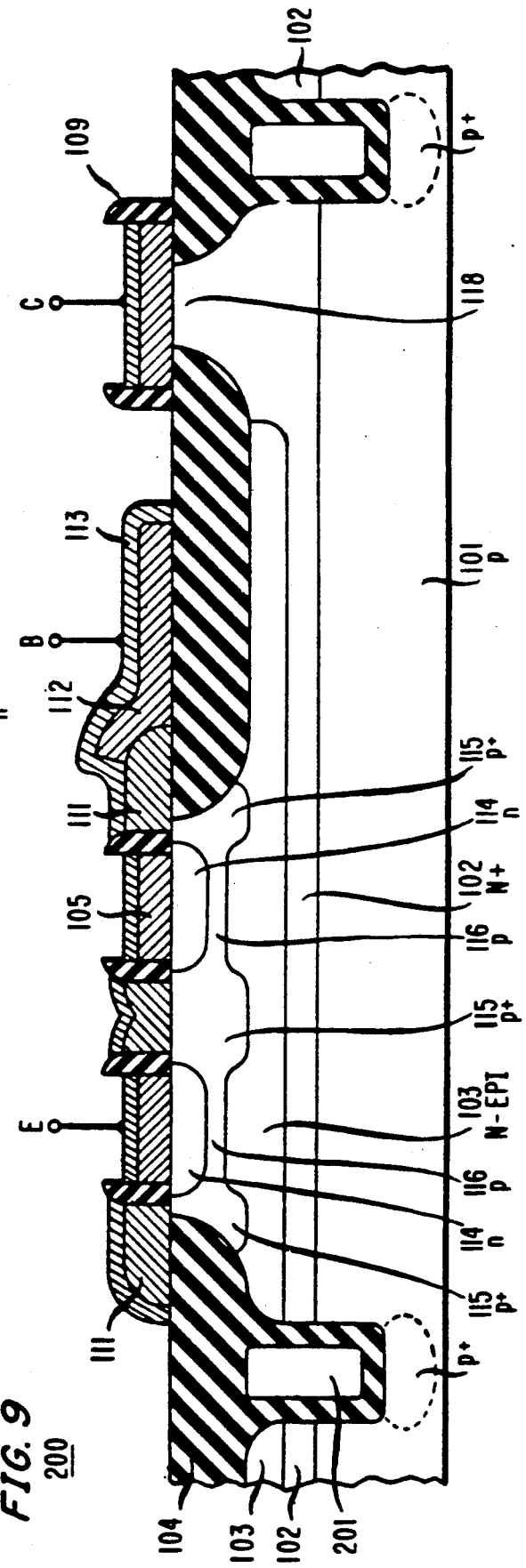
FIG. 9 illustrates the schematic of a completed bipolar transistor fabricated according to the steps illustrated in FIGS. 1-8.
Figure 10:
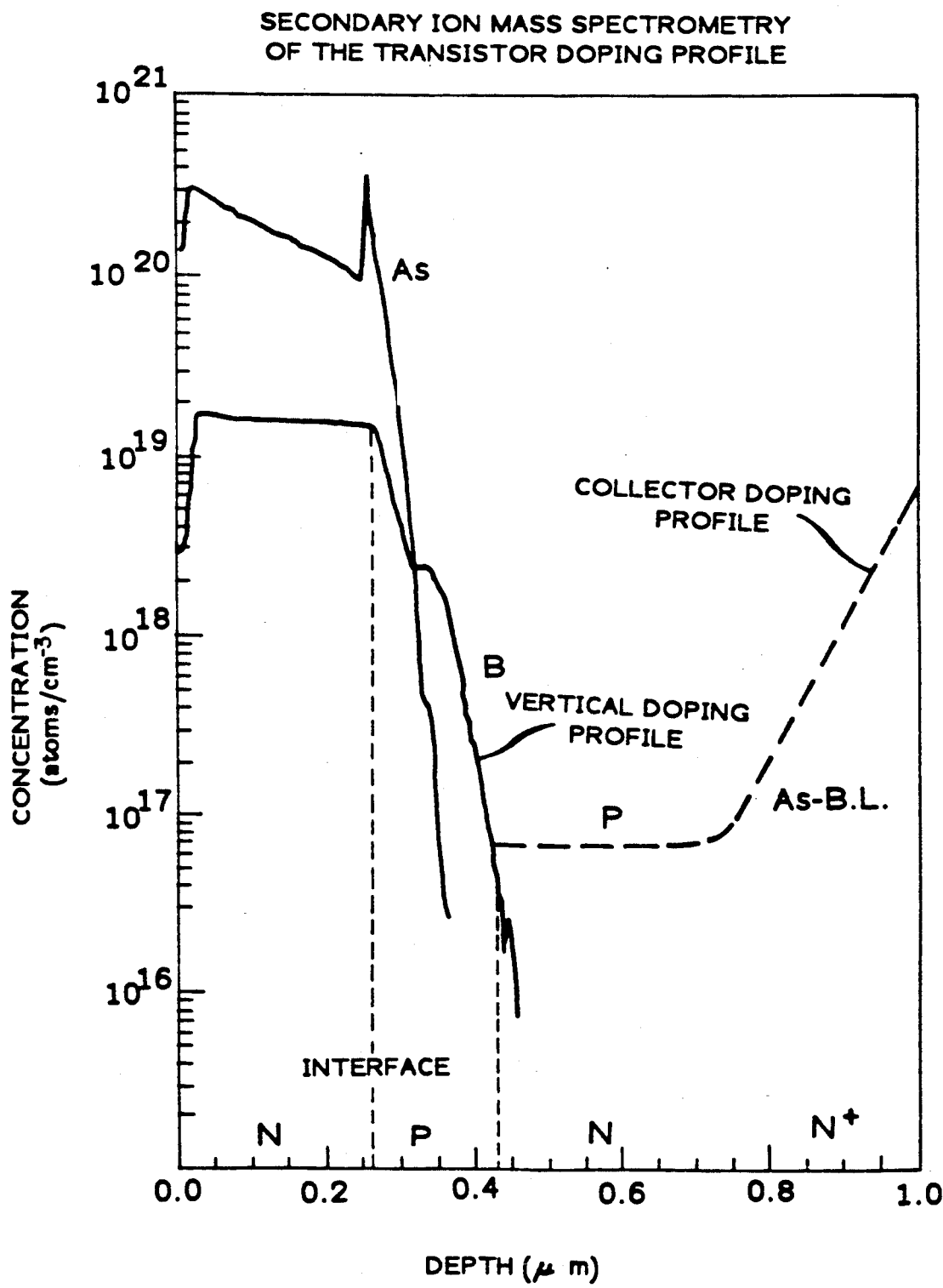
FIG. 10 illustrates the doping profiles of the transistor depicted in FIG. 9.

Illustrated in FIG. 9 is the schematic of completed n-p-n transistor 200 which was fabricated according to the above inventive fabrication method. Like designation of FIGS. 1–8 corresponds to like elements in FIG. 9. The vertical doping profile, as shown in FIG. 10, was measured by Secondary Ion Mass Spectrometry. Additionally, superimposed on the profile is the collector doping profile obtained from the SUPREM III ® process simulation program. As noted from FIG. 10, the doping concentration in collector region 118 is higher than most conventional bipolar transistors so as to delay the onset of the base push-out effect. A Gummel plot of transistor 200, which measures 0.75 $\mu m \times 9$ $\mu m$, indicates a peak current gain of 85. While the current gain is somewhat low, it is believed that optimizing the silicidation process will substantially improve the current drive thereof.

It should be recalled that the emitter region utilized a multi-finger design in order to space the emitter stripe regions closely to the extrinsic base region, among other things, for reducing the total collector area. In particular, transistor 200 had 10 $\mu m$ length emitter fingers with a width and spacing of 0.75 $\mu m$. Split base transistor resistance measurements indicated an extracted base resistance of less than 120 $\Omega$ and a calculated extrinsic base resistance of less than 30 $\Omega$, including the series resistance of the link-up region, the extrinsic diffusion region, the silicide electrode and the metal contact (not shown).

Referring to FIGS. 7 and 9, the emitter-base junction was isolated by field oxides 104 on two sides and on the other sides by sidewall oxides 111. I-V measurements of the emitter-base junction and base-collector junction indicate each has a slope of about 64 mV/decade, which approximates the characteristics of an ideal diode. Further, trench sidewalls 201 provide excellent isolation as evident by the low leakage current measured under reversed biased condition.

One of the primary advantages of the structure and the fabrication method thereof is the effective reduction of parasitic capacitances therein. The parasitic capacitance for three different size transistors with a collector concentration of $7 \times 10^{16}$ cm$^{-3}$, were measured. The base-emitter capacitance was found to be substantially lower than those of prior self-aligned transistors utilizing double polysilicon layers because of, among other things, the non-overlapping structure. Usually, the ECL gate delay in today's high speed silicon bipolar devices is primarily controlled by the collector-base capacitance. Because the emitter fingers are spaced closely and share the same polysilicon base electrode, the base-collector capacitance can be substantially minimized, especially for long length emitter designs. For example, a 0.75 $\mu m \times 9$ $\mu m$ device has less than twice the base-collector capacitance as a 0.75 $\mu m \times 3$ $\mu m$ device.

Results from experimental practice indicate that for a 0.75 $\mu m \times 27$ $\mu m$ size transistor, the peak cut-off frequency $f_t$ is approximately 14.5 GHz at a collector current density of 35 kA/cm$^2$. This is with a doping concentration in the collector region of $\sim 4 \times 10^{16}$ cm$^{-3}$, which is a typical value for a range of power-delay trade-off designs. Furthermore, results from computer simulation, such as from the ADVICE ® program simulation, indicate that a stage delay of $\sim 20$ to 30 ps with a voltage swing of 400 mW is achievable.

In order to better understand the advantages of the present inventive method, it is interesting to compare some processing and structural characteristics thereof to the prior art. Typically, self-aligned transistors utilizing prior art fabrication techniques require that the intrinsic base region be subjected to over-etching, which resulted in a nonuniform thickness, i.e. base width, along the lateral direction. In contradistinction, the surface of the intrinsic area of fabricated transistors are not exposed to etching. Etching only occurs outside the intrinsic area where effects dependent on nonuniform thickness are minimal. Additionally, as noted aboveherein, the juxtaposition of emitter fingers was limited by the resistive requirement of the underlying polysilicon layer used to contact the base region. In the prior art, the metallization of the underlying polysilicon layer was prohibitively complex due to the restrictions associated with the subsequent deposition of the upper polysilicon layer use to contact the emitter region. In present method, the conductive regions, namely, polysilicon region 111 and interconnect layer 112, can be metalized to advantageously lower their resistivity and, thus, increase the speed of the device because of the reduced series base resistance. Furthermore, this metallization may be effected with low temperature silicide since no high temperature processing is involved therein and, moreover, may also be performed in a single step.

Apposite to the speed of the devices fabricated with the present method is the fact that the structure thereof permits the division of emitter fingers into multiple, closely spaced emitter regions having a shared interposed common base electrode, i.e. polysilicon region 111. As a result, the higher packing density not only affords a lower base resistance, but, also a lower collector-substrate capacitance that results in higher speeds. It is anticipated that the close emitter stripe spacing will permit the fastest speed available for digital applications, excluding the use of GaAs bipolar devices.

An additional advantage to the present method is that it is possible to engineer the lateral p-doping in the base region. While the fabricated device above was a vertical n-p-n transistor, the p-region extends laterally on either side thereof. It is this lateral extension which can be more effectively engineered because, unlike prior fabrication techniques which utilized a two p-doping step, the present method involves three p-doping steps: intrinsic base region, link-up region and extrinsic base region. Those skilled in the art will observe that the additional doping step allows the link-up region to be more effectively engineered. In particular, by optimizing the horizontal doping profile in the link-up region, the device reliability associated with electron trapping may be improved by orders of magnitude. Additionally, the horizontal doping can be sufficiently large enough to prevent emitter to collector punch through and low enough to prevent emitter to base tunneling.

It is anticipated that bipolar transistors fabricated according the teachings of this invention will have numerous applications. For example, they may be used in high speed optical repeaters where they will be able to operate at data rates in excess of ten giga-bits per second. Furthermore, such device structure will be more compatible with MOS devices because of their surface planarity.

It should be understood that the present fabrication method is applicable to other semiconductor devices, such as MOS devices, where it is desirable to contact a surface region located between an digitated electrode having a small pitch. Various modifications may also be made by those skilled in the art which embody the teachings of the invention and fall within the spirit and scope thereof. For example, instead of utilizing a digitated electrode, it may be possible to use instead an interdigitated structure and still contact with a single electrode the surface located therebetween.

We claim:

1. In a process for electrically contacting a plurality of first semiconductor regions alternating with a plurality of second semiconductor regions formed in a semiconductor substrate, wherein said pluralities of said first and second semiconductor regions are included in a single semiconductor device a method comprising the steps of:

forming a digitated electrode having a plurality of fingers over said semiconductor substrate, each finger disposed only over one of said second semiconductor regions;

depositing a conformal insulating layer over said semiconductor substrate;

anisotropically etching said conformal insulating layer to form a insulating region on the edges of said fingers, said insulating region being substantially planar with said digitated and non-overlapping electrode;

depositing a conformal conductive layer over said semiconductor substrate; and anisotropically etching said conformal conductive layer substantially to the same height as said insulating region to create a contiguous conductive region for contacting said first semiconductor regions, said contiguous conductive region at least disposed over first semiconductor regions positioned between said fingers of digitated electrode such that a self-aligned common electrode is formed having a structure complementary to the digitated electrode for contacting said first semiconductor regions.

2. In the method as defined in claim 1 further comprising the steps:

forming first and second silicide layers over said digitated electrode and said contiguous conductive layer, respectively; and forming first and second metallization layers on first and second silicide layers, respectively.

3. The method as defined in claim 2 wherein said insulating region is an oxide.

4. The method as defined in claim 3 wherein said first semiconductor regions have a conductivity type opposite to the conductivity type of said second semiconductor regions.

5. The method as defined in claim 3 wherein said first semiconductor regions have a conductivity type the same as the conductivity type of said second semiconductor regions.

* * * * *